United States Patent
Habuto et al.

(10) Patent No.: US 6,810,441 B1
(45) Date of Patent: Oct. 26, 2004

(54) APPARATUS, METHOD AND SYSTEM FOR READING/WRITING DATA, AND MEDIUM FOR PROVIDING DATA READ/WRITE PROGRAM

(75) Inventors: Reiko Habuto, Kanagawa (JP); Yoshiyasu Kubota, Kanagawa (JP)

(73) Assignee: Sony Corporation, Tokyo (JP)

( * ) Notice: Subject to any disclaimer, the term of this patent is extended or adjusted under 35 U.S.C. 154(b) by 327 days.

(21) Appl. No.: 09/668,089

(22) Filed: Sep. 22, 2000

(30) Foreign Application Priority Data

Sep. 24, 1999 (JP) .......................................... 11-271147

(51) Int. Cl.[7] .............................................. G06F 3/00
(52) U.S. Cl. ...................... 710/20; 710/13; 710/301; 348/222.1; 348/231.9
(58) Field of Search .................... 710/13, 20, 301; 386/65, 75; 348/222.1, 231.9

(56) References Cited

U.S. PATENT DOCUMENTS

| | | | |
|---|---|---|---|
| 5,226,145 A | | 7/1993 | Moronaga et al. |
| 5,251,297 A | * | 10/1993 | Takayanagi .................. 345/530 |
| 5,436,657 A | | 7/1995 | Fukuoka |
| 5,699,549 A | * | 12/1997 | Cho .......................... 711/115 |
| 5,806,072 A | * | 9/1998 | Kuba et al. .................. 707/200 |
| 5,886,957 A | | 3/1999 | Yokota et al. ............ 369/13.37 |
| 5,982,981 A | * | 11/1999 | Satoh ........................ 386/107 |
| 6,192,191 B1 | * | 2/2001 | Suga et al. .................. 386/120 |
| 6,341,196 B1 | * | 1/2002 | Ando et al. ................... 386/95 |
| 6,453,281 B1 | * | 9/2002 | Walters et al. .............. 704/200 |
| 6,466,263 B1 | * | 10/2002 | Suzuki .................... 348/220.1 |

FOREIGN PATENT DOCUMENTS

| | | |
|---|---|---|
| EP | 0 473 516 | 3/1992 |
| EP | 0 697 699 | 2/1996 |
| EP | 0 737 980 | 10/1996 |

OTHER PUBLICATIONS

Patent Abstracts of Japan vol. 017, No. 381 (P–1574), Jul. 16, 1993 & JP 05 061760 A (Fuji Photo Film Co Ltd), Mar. 12, 1993.

* cited by examiner

*Primary Examiner*—Jeffrey Gaffin
*Assistant Examiner*—Eron Sorrell
(74) *Attorney, Agent, or Firm*—Frommer Lawrence & Haug LLP; William S. Frommer; Dennis M. Smid

(57) ABSTRACT

A data read/write apparatus records, in a root directory of a recording medium, a file "MEM***.ind" indicating the type of the recording medium, a directory "DCIM" for storing still image files, a directory "VOICE" for storing voice files, a directory "HIFI" for storing audio files, and a directory "MS****" for storing information inherent to a vendor. The rules are defined as the method for recording data in the recording medium. Hence, an audio-visual apparatus can determine the type of data stored in the loaded recording medium, recognizes the format of data in a non-conforming format, and erases the data in the non-conforming format.

83 Claims, 9 Drawing Sheets

MOVIE

IMAGE

AUDIO

VOICE

DATA

FIG. 10

/ROOT/ ---+--- /HIFI/ ----+-- { purpose.dir } → CONTENT : "AUDIO / MUSIC"
          |               +-- { audio1.au }
          |               +-- { audio2.au }

APPARATUS, METHOD AND SYSTEM FOR READING/WRITING DATA, AND MEDIUM FOR PROVIDING DATA READ/WRITE PROGRAM

BACKGROUND OF THE INVENTION

1. Field of the Invention

The present invention relates to an apparatus, a method, and a system for reading and/or writing data in at least one conforming format from/to a recording medium capable of recording data in a plurality of formats, and a medium for providing a data read/write program.

2. Description of the Related Art

Recently, various audio-visual apparatuses (hereinafter referred to as "AV apparatuses") for reading and/or writing data, such as digital still cameras, have been widely used. Accordingly, removable recording media using flash memory and the like have been developed for these AV apparatuses.

These recording media are capable of simultaneously recording data in a plurality of types of formats, such as moving Image data, still image data, audio data (music data), and voice data. With these recording media, a user is not required to use a plurality of recording media each corresponding to different AV apparatuses for handling data in different formats. A single recording medium can be shared by a plurality of AV apparatuses.

For example, a digital still camera only handles still image data. Generally, an AV apparatus is designed to handle data in a specific format. When a recording medium which stores data in non-conforming formats is loaded in the AV apparatus, the AV apparatus cannot recognize information including the content and the size of data in these non-conforming formats. This results from the fact that the data recording method for each format and the recording location in the recording medium are not clearly programmed into a data read/write device. Furthermore, there is a wide variety of formats for handling data.

When the user loads a recording medium storing data in a plurality of formats in the AV apparatus, the user can only know the residual recording capacity of the entire recording medium and the content of data in a conforming format. The user cannot know the content of data in non-conforming formats. Using a recording medium capable of simultaneously storing data in a plurality of formats may lead to confusion which does not occur in using a conventional recording medium which conforms only to the AV apparatus to be used.

SUMMARY OF THE INVENTION

In view of the above circumstances, it is an object of the present invention to provide an apparatus, a method, and a system for reading/writing data, and a medium for providing a data read/write program for solving the above problems with a conventional recording medium capable of simultaneously recording data in a plurality of formats and for providing a user with advantages even when data in a plurality of formats are simultaneously stored in a recording medium.

To this end, according to an aspect of the present invention, there is provided a data reading-and-writing apparatus for reading and writing data in at least one conforming format from and to a recording medium capable of recording data in a plurality of formats. The data reading-and-writing apparatus includes a reading-and-writing unit for performing reading and writing to the recording medium. A control unit controls the data reading-and-writing apparatus so as to record the data in the conforming format in a predetermined directory of the recording medium, to read the data in the conforming format from the predetermined directory of the recording medium, and to recognize information concerning data in a non-conforming format, which differs from the conforming format, by referring to a directory other than the predetermined directory of the recording medium.

According to another aspect of the present invention, there is provided a data reading-and-writing method for a data reading-and-writing apparatus for reading and writing data in at least one conforming format from and to a recording medium capable of recording data in a plurality of formats. The data reading-and-writing method includes a writing step of writing the data in the conforming format in a predetermined directory of the recording medium. In a reading step, the data in the conforming format is read from the predetermined directory of the recording medium. In a recognizing step, information concerning data in a non-conforming format, which differs from the conforming format, is recognized by referring to a directory other than the predetermined directory of the recording medium.

According to another aspect of the present invention, there is provided a data reading-and-writing system having a recording medium capable of recording data in a plurality of formats and a data reading-and-writing apparatus for reading and writing data in at least one conforming format from and to the recording medium. The data reading-and-writing system includes a reading-and-writing unit for performing reading and writing to the recording medium. A control unit controls the data reading-and-writing apparatus so as to record the data in the conforming format in a predetermined directory of the recording medium, to read the data in the conforming format from the predetermined directory of the recording medium, and to recognize information concerning data in a non-conforming format, which differs from the conforming format, by referring to a directory other than the predetermined directory of the recording medium.

According to another aspect of the present invention, there is provided a program providing medium for providing a data reading-and-writing program to be applied to a data reading-and-writing apparatus for reading and writing data in at least one conforming format from and to a recording medium capable of recording data in a plurality of formats. The data reading-and-writing program includes a writing step of writing the data in the conforming format in a predetermined directory of the recording medium. In a reading step, the data in the conforming format is read from the predetermined directory of the recording medium. In a recognizing step, information concerning data in a non-conforming format, which differs from the conforming format, is recognized by referring to a directory other than the predetermined directory of the recording medium.

Accordingly, it is possible to provide a user with advantages even when a recording medium stores data in a plurality of formats.

BRIEF DESCRIPTION OF THE DRAWINGS

FIG. 10 is an illustration of an example of the directory structure in the recording medium in which a file indicating the content of a directory is stored in that directory.

DESCRIPTION OF THE PREFERRED EMBODIMENTS

Figure 1:
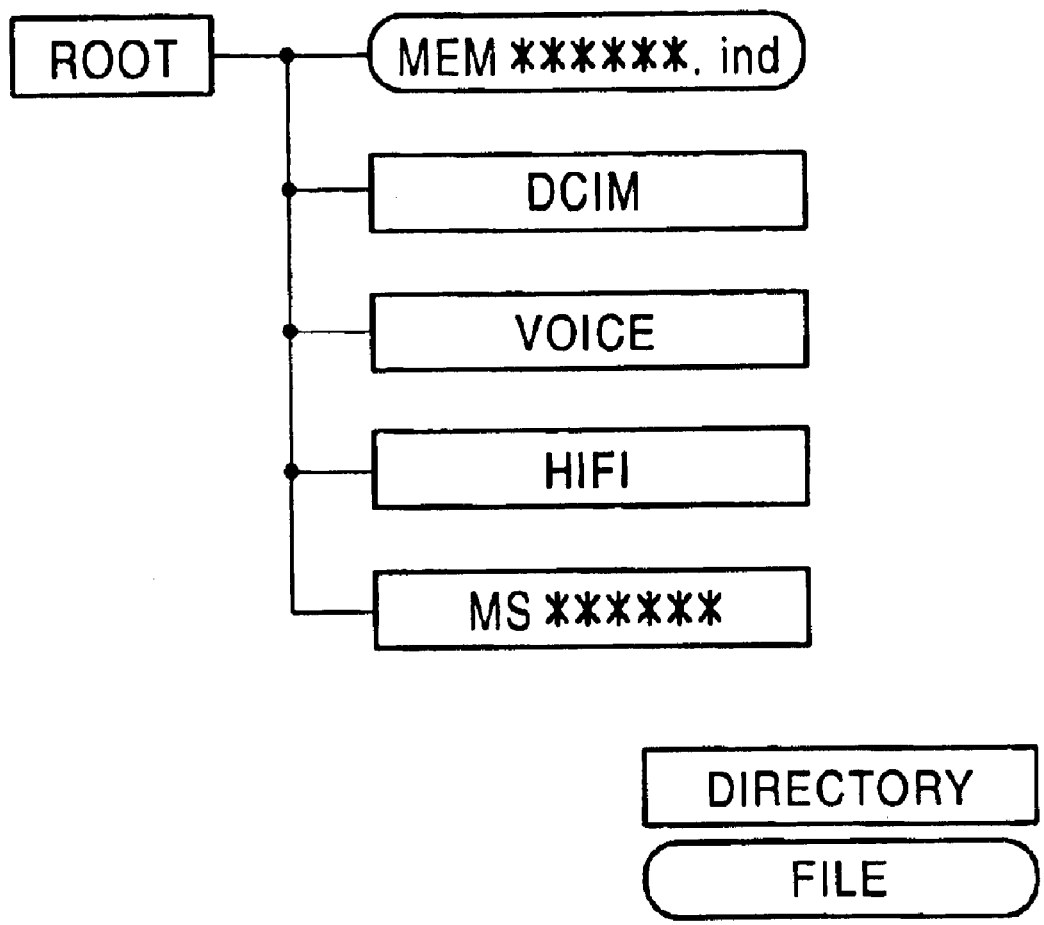
FIG. 1 is an illustration of an example of the directory structure in a recording medium which forms a data read/write system according to an embodiment of the present invention.

The present invention will be understood from the following description of the preferred embodiments with reference to the accompanying drawings.

A data read/write system according to an embodiment of the present invention includes a recording medium using a non-volatile flash memory capable of simultaneously recording various data in a plurality of formats, such as moving image data, still image data, audio data (music data), and voice data, and an audio-visual apparatus (hereinafter referred to as an "AV apparatus"), in which the recording medium is loaded/unloaded, for reading and/or writing various data from/to the recording medium.

The AV apparatus in the data read/write system clearly defines a method for recording data in the recording medium. Irrespective of the data format, the AV apparatus can recognize and handle data in a non-conforming format by sharing minimal information. This enables a user to recognize the data in a format to which the AV apparatus does not conform. When the capacity of the recording medium becomes insufficient, the data in the non-conforming format can be erased. Specifically, a recording medium storing still image data and audio data is loaded in a digital still camera capable of handling only still image data. The user can recognize the still image data which is data in a format to which the digital still camera conforms, and the still image data can be read. Concerning the audio data which is data in a non-conforming format, the user can recognize the type of data. If the capacity for recording still image data in the recording medium is insufficient, the audio data, which is data in the non-conforming format, can be erased. In the following description, a format to which the AV apparatus conforms is referred to as a conforming format, and a format to which the AV apparatus does not conform is referred to as a non-conforming format. Actual data recorded on the recording medium is referred to as a file.

A method for recording data on the recording medium using the flash memory is described. Although the recording medium using the flash memory may be used as a general-purpose recording medium, it is assumed that the recording medium using the flash memory is used by a dedicated AV apparatus in which the user can use the recording medium without paying direct attention to internal files. In the recording medium, a data format of a file or a directory name for recording a file are defined. The AV apparatus is required to record data in the recording medium in accordance with the defined information. The following description defines how to locate a file to be recorded in the recording medium.

In the recording medium, in order that the AV apparatus can easily search the recorded files for files in the conforming format and efficiently locate the files, directories and files are located according to three rules described below.

First, a data file is not directly located in a root directory. Second, a data file is recorded in a predetermined format in a directory created for each application. Third, a file inherent to a vendor is recorded in a directory created for each vendor.

The directory name and the file name created in the root directory are as shown in Table 1. Specifically, the root directory of the recording medium stores a file "MEM***.ind" indicating the type of recording medium such as a so-called memory stick (trademark of Sony Corporation), a directory "DCIM" for storing still image files, a directory "VOICE" for storing voice files, a directory "HIFI" for storing audio files, a directory "CONTROL" for storing control information files, a directory "TEL" for storing telephone and facsimile information files, a directory "OPEN-R" for storing entertainment robot information files, and a directory "MS****" for storing information inherent to a vendor.

TABLE 1

| Directory (File) Name | Purpose |
| --- | --- |
| MEM*****.ind | file indicating the type of recording medium |
| DCIM | directory for storing still image files |
| VOICE | directory for storing voice files |
| HIFI | directory for storing audio files |
| CONTROL | directory for storing control information files |
| TEL | directory for storing telephone and facsimile information files |
| OPEN-R | directory for storing entertainment robot information files |
| MS****** | directory for storing information inherent to vendor (****** is designated for each vendor) |

In the recording medium, directories and files other than those shown in Table 1 are prohibited from being located in the root directory. The directories in the root directory may be extended if necessary. The files inherent to the vendor are located in the directory "MS****", defined for each vendor. The directory and file structure in the directory "MS****" is free.

Extension of the directories in the root directory is performed in accordance with two rules described below.

A first rule is to create a new directory conforming to a new application. This prevents a file for a certain application from being recorded in the directory "MS******" which is inherent to each vendor, thereby eliminating the possibility of prohibiting another AV apparatus from gaining access to that file.

A second rule is to register the name of the directory "MS****", which is defined for each vendor, in order to avoid unwanted duplication. In principle, the name of the directory "MS****" is registered such that a single name is given for a single vendor.

FIG. 1 shows an example of the directory structure in the recording medium created in accordance with the above rules. In this example, the recording medium can store still image files, voice files, audio files, and files inherent to a vendor. Under the directory "MS******" inherent to the vendor, files can be freely located at locations according to each vendor. Under other directories, file formats and locations are required to be in accordance with the corresponding formats.

With the rules as determined above, the AV apparatus can determine the type of data stored in the loaded recording medium.

In the data read/write system including the recording medium and the AV apparatus capable of reading and/or writing data from/to the recording medium, the user can be informed of the content of files recorded in the recording medium and conditions in response to operations performed by the user in accordance with rules described below.

In the data read/write system, the user can be informed by displaying a message on a display unit of the AV apparatus, by displaying a so-called Icon on the display unit, by changing a light emitting state, that is, by switching on or flashing a light emitting diode (hereinafter referred to as an "LED") or the like provided in the AV apparatus, or by producing a beep from a speaker of the AV apparatus. These processes of informing the user of various conditions are described below. If necessary, a data group in directory units in the root directory of the recording medium is referred to as a category.

The data read/write system determines the content of data recorded on the recording medium and informs the user of various conditions in accordance with the determination. This informing step is triggered when the recording medium which only stores data in a format not conforming to the AV apparatus is loaded, and when the AV apparatus enters a read mode or when the user presses a content determination key provided in the AV apparatus.

Figure 2:
FIG. 2 is an illustration of an example of an icon displayed when data belonging to a conforming category is not recorded in the recording medium.
Figure 3A:
FIGS. 3A to 3E are illustrations of examples of icons for different categories.
Figure 3B:
Figure 3C:
Figure 3D:
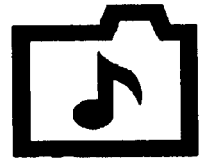
Figure 3E:

In this case, as in the digital still camera which only handles still image files, the AV apparatus conforming to only one category displays a message, such as "NO IMAGE", on the display unit (not shown) or the like, indicating that data which belongs to a conforming category is not recorded on the recording medium. Alternatively, the AV apparatus can display an icon shown in FIG. 2 on the display unit (not shown) or the like. Alternatively, the AV apparatus causes the LED (not shown) to perform an arbitrary light emitting operation or generates an arbitrary beep from the speaker (not shown).

In contrast, as in the digital still camera which handles still image files and audio files, the AV apparatus conforming to a plurality of categories displays messages, such as "NO IMAGE" and "NO AUDIO", for each category or displays messages, such as "UNKNOWN DATA" and "INCOMPATIBLE DATA", on the display unit (not shown) or the like. Hence, the user is informed of the fact that data belonging to a conforming category is not recorded on the recording medium. Alternatively, the AV apparatus displays the icon shown in FIG. 2 on the display unit (not shown) and informs the user of the fact that data belonging to a conforming category is not recorded on the recording medium. By displaying the icons as shown in FIGS. 3A to 3E for different categories on the display unit (not shown) or the like, the user is informed of categories of data stored in the recording medium. The AV apparatus causes the LED (not shown) to perform an arbitrary light emitting operation and generates an arbitrary beep from the speaker (not shown).

The data read/write system warns the user of various conditions in response to operations performed by the user.

The warning is triggered when the recording medium that does not store data belonging to a category to which the AV apparatus conforms is loaded in the AV apparatus, and when a read key provided in the AV apparatus is pressed by the user.

In this case, the AV apparatus displays a message, such as "CANNOT PLAY" or "CANNOT READ", on the display unit (not shown) or the like, indicating that, when the read key is pressed by the user, data cannot be read by the AV apparatus although some data is stored in the recording medium. The AV apparatus may display the icon shown in FIG. 2 on the display unit (not shown). Alternatively, the AV apparatus may cause the LED (not shown) to perform an arbitrary light emitting operation or generate an arbitrary beep from the speaker (not shown).

When the AV apparatus is capable of both reading and writing data, the user is warned in the following cases. The warning is triggered when the loaded recording medium is physically or electrically damaged, or when the recording medium is formatted in an erroneous file allocation table (FAT) format or in a format other than the FAT format, thereby preventing reading and writing of data. The warning is also triggered when a file recorded on the loaded recording medium cannot be read. The warning is also triggered when the loaded recording medium is locked, and when the user presses a write key in order to write data. The warning is also triggered when the user presses the write key or the read key while the recording medium is not loaded. The warning is also triggered when there is no residual recording capacity of the loaded recording medium or when the residual recording capacity of the loaded recording medium is insufficient. The warning is also triggered when an empty recording medium is loaded and when the user presses the read key. The warning is also triggered when the recording medium storing copyrighted data is loaded in an AV apparatus which does not conform to the copyright. The warning is also triggered when a recording medium storing copyrighted data in which reading of the content is restricted is loaded in the AV apparatus, and when a lock switch is turned on and the user presses the read key.

When the AV apparatus is only capable of reading data, the user is warned in the following cases. The warning is triggered when the loaded recording medium is physically or electrically damaged, or when the recording medium is formatted in an erroneous FAT format or in a format other than the FAT format, thereby preventing reading of data. The warning is also triggered when a file recorded on the loaded recording medium cannot be read. The warning is also triggered when the user presses the read key while the recording medium is not loaded. The warning is also triggered when an empty recording medium is loaded and when the user presses the read key. The warning is also triggered when the recording medium storing copyrighted data is loaded in an AV apparatus which does not conform to the copyright. The warning is also triggered when a recording medium storing copyrighted data in which reading of the content is restricted is loaded in the AV apparatus, and when the lock switch is turned on and the user presses the read key.

The data read/write system informs the user of the state of the relationship between the AV apparatus and the recording medium. The user can be informed by, for example, displaying the loading/unloading state of the recording medium relative to the AV apparatus, by displaying an icon near a loading section so as to indicate a location at which the recording medium is loaded and/or a method for loading the recording medium in the AV apparatus, by displaying that the recording medium can be loaded/unloaded in a specific direction, by displaying completion of correct loading of the recording medium, and by displaying that the recording medium is being accessed, formatted, or written to so that loading/unloading of the recording medium in/from the AV apparatus is performed after data writing is terminated.

When the AV apparatus is capable of both reading and writing data, the user is informed of the state of these relationships in the following cases. Specifically, such an informing step is triggered when the recording medium is loaded or unloaded from the AV apparatus, or when the recording medium is not appropriately loaded in the AV apparatus. The informing step is also triggered when the loaded recording medium is being accessed by the AV apparatus and when a condition in which an operation is not accepted lasts, for example, for two seconds or more. The informing step is also triggered when the recording medium is being formatted, or when data is being recorded on the recording medium.

When the AV apparatus is only capable of reading data, the user is informed of the state of these relationships when the recording medium is loaded or unloaded from the AV apparatus, or when the recording medium is not appropriately loaded in the AV apparatus. The informing step is also triggered when the recording medium is being accessed by the AV apparatus and a condition in which an operation is not accepted lasts, for example, for two seconds or more.

The data read/write system informs the user of the residual recording capacity of the recording medium. This of is triggered when the recording medium is loaded in the AV apparatus or when the user presses a confirmation key for confirming the residual capacity. The user can be informed of the residual capacity by displaying specific numeric values, such as the number of files and time, on the display unit (not shown) or the like for each operating mode corresponding to a category in which the AV apparatus can write data. When the residual capacity cannot be expressed by a numeric value, the ratio of the residual capacity to the entire capacity can be displayed by a bar chart on the display unit (not shown) or the like. It is also possible to switch from displaying the ratio of the residual capacity to the entire capacity to displaying the ratio of the used capacity to the entire capacity. In any case, it is preferable that the AV apparatus indicate which one of the used capacity and the residual capacity is displayed.

The data read/write system warns the user of erasing of data including initialization. Such a warning is necessary when the AV apparatus is capable of both reading and writing data.

Particularly in the case of initialization, when an unformatted recording medium or a recording medium in a different format is loaded in the AV apparatus, the warning is triggered. In the case of initialization, the AV apparatus displays a message, such as "FORMAT ERROR", on the display unit (not shown) indicating that initialization of the recording medium is necessary, together with a confirmation message indicating that all recorded data is to be erased. When initializing the recording medium, the AV apparatus may display, on the display unit (not shown) or the like, the used recording capacity of the recording medium or icons, as shown in FIGS. 3A to 3E, indicating the categories of the recorded data. Alternatively, the AV apparatus may cause the LED (not shown) to perform an arbitrary light emitting operation or produce an arbitrary beep from the speaker (not shown). In this case, the AV apparatus is required to have a confirmation step or a physical safeguard against accidental data erasing by the user.

In the AV apparatus, two types of data erasing are possible. One is complete erasing and the other is selective erasing.

Complete erasing erases all data irrespective of whether the recorded data on the recording medium belongs to the category to which the AV apparatus conforms. This operation is the same as the initialization. Complete erasing is performed when an unformatted recording medium or a recording medium in which internal data is damaged is loaded in the AV apparatus. In this case, the AV apparatus displays a message, such as "FORMAT", indicating that the recording medium is to be initialized, on the display unit (not shown) or the like. When initializing the recording medium, the AV apparatus displays, on the display unit (not shown) or the like, the used recording capacity of the recording medium or the icons shown in FIGS. 3A to 3E, indicating the categories of the recorded data. Alternatively, the AV apparatus may cause the LED (not shown) to perform an arbitrary light emitting operation or generate an arbitrary beep from the speaker (not shown).

Selective erasing is broadly classified into two cases. One is to erase data belonging to the category to which the AV apparatus conforms. The other is to erase data belonging to a category to which the AV apparatus does not conform.

When erasing data belonging to the category to which the AV apparatus conforms, there are two cases in which all data belonging to the conforming category are erased and data belonging to the conforming category is erased in content units. In these cases a protected file will not be erased.

When erasing all data belonging to the conforming category, the AV apparatus displays, on the display unit (not shown) or the like, a confirmation message, such as "ERASE (DELETE) ALL" or "ERASE (DELETE) ALL MUSIC", indicating that all data belonging to the conforming category are to be erased. When the recording medium stores a non-conforming version of the data, the AV apparatus displays a confirmation message on the display unit (not shown) or the like indicating that the data is to be erased.

In contrast, when erasing data belonging to the conforming category in content units, the AV apparatus displays, on the display unit (not shown) or the like, a confirmation message, such as "ERASE (DELETE) MUSIC", indicating that data for one file belonging to the conforming category is to be erased. The AV apparatus displays, on the display unit (not shown) or the like, the size of the data to be erased. When the recording medium stores a non-conforming version of the data, the AV apparatus displays on the display unit (not shown) or the like a confirmation message indicating that the data is to be erased.

When erasing data belonging to a category to which the AV apparatus does not conform, the data belonging to the non-conforming category is erased either in category units or in content units. When the data, which belongs to the non-conforming category, stored in the recording medium is recorded by another apparatus, the AV apparatus can erase the data if the content of the data is determinable. In this case, a protected file will be erased.

When erasing the data belonging to the non-conforming category in category units, the AV apparatus displays, on the display unit (not shown) or the like, a confirmation message, such as "ERASE (DELETE) AUDIO FILE" or "ERASE (DELETE) AUDIO FILE INCLUDING PROTECTED FILE", indicating that the non-conforming category is to be erased. The AV apparatus may display, on the display unit (not shown) or the like, the size of the category to be erased. When the recording medium stores data concerning the category to be erased or a different version of the data, the AV apparatus displays, on the display unit (not shown), a confirmation message indicating that the data is to be erased.

In contrast, when erasing the data belonging to the non-conforming category in content units, the AV apparatus displays, on the display unit (not shown), a confirmation message, such as "ERASE (DELETE) MUSIC", indicating that data for one file belonging to the category to be erased is to be erased. The AV apparatus displays the size of the data to be erased. When the recording medium stores data concerning the data to be erased or a different version of the data, the AV apparatus displays a confirmation message on the display unit (not shown) indicating that the data is to be erased.

Selective erasing includes erasing of all categories to which the AV apparatus does not conform. This is performed to increase the free capacity of the recording medium. When the recording medium stores the non-conforming categories recorded by a different apparatus, the AV apparatus erases all the categories. Specifically, for example, a recording medium stores 1 MB of data recorded by a voice recorder and 2 MB of data recorded by an audio apparatus. This recording medium is loaded in a digital still camera which conforms only to still image data. Subsequent to recording 10 MB of still image data, the digital still camera can erase 1 MB of voice data and 2 MB of audio data. In this case, the AV apparatus displays, on the display unit (not shown), a confirmation message, such as "ERASE (DELETE) INCOMPATIBLE DATA", "ERASE (DELETE) UNKNOWN DATA", or "ERASE DATA EXCEPT FOR STILL IMAGE DATA, INCLUDING PROTECTED FILE", indicating that all data belonging to the non-conforming categories are to be erased. The AV apparatus displays, on the display unit (not shown) or the like, the capacity of the categories to be erased.

As described above, the data read/write system informs the user of various conditions using the above processes.

Figure 4:
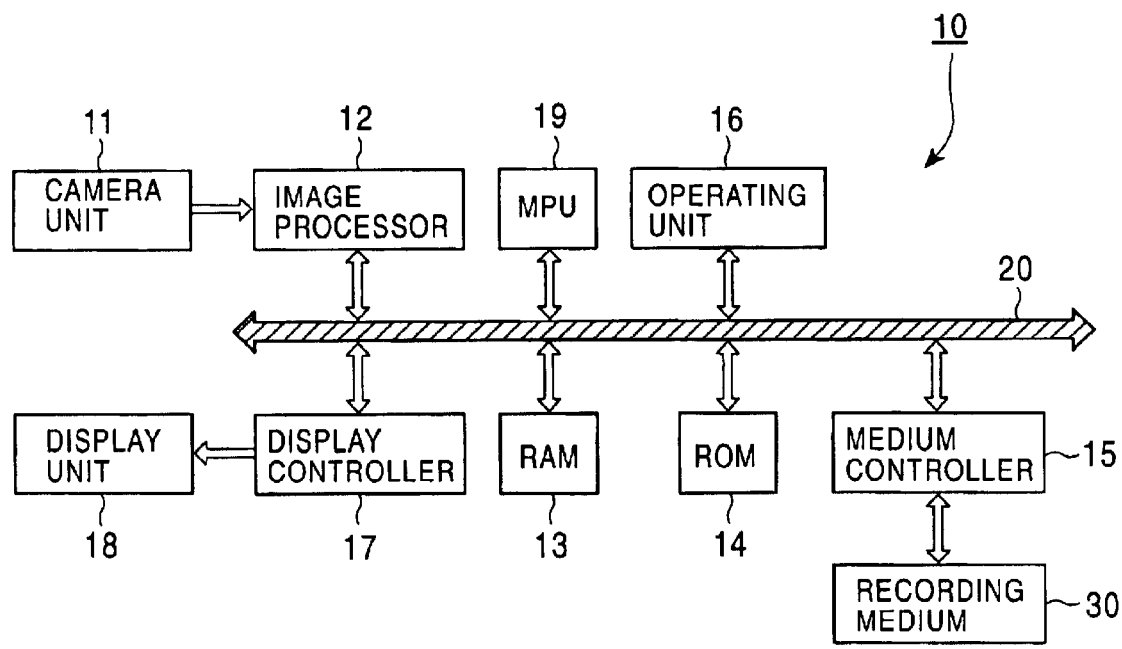
FIG. 4 is a block diagram of the structure of a digital still camera used as an AV apparatus which forms the data read/write system of the embodiment.

The operation in accordance with the above rules is described using a digital still camera 10 for capturing still images, which is shown in FIG. 4, as the AV apparatus by way of example.

Referring to FIG. 4, the digital still camera 10 includes a camera unit 11 for capturing an image of a subject, an image processor 12 for processing still image data captured by the camera unit 11, a random access memory (RAM) 13 used as a working area for temporarily storing various data, a read only memory (ROM) 14 used as a read only storage for storing a data read/write program for performing various processing and various information such as the corresponding relationship information indicating the corresponding relationship between the directory name and the content in each category, a medium controller 15 for loading and controlling a recording medium 30, an operating unit 16 for allowing a user to input various information, a display controller 17 for controlling a display unit 18 described below, and a microprocessor unit (MPU) 19 for controlling each unit. In the digital still camera 10, the image processor 12, the RAM 13, the ROM 14, the medium controller 15, the operating unit 16, the display controller 17, and the MPU 19 are interconnected by a system bus 20. The recording medium 30 stores various data including still image data and audio data.

When the MPU 19 reads and runs the data read/write program stored in the ROM 14, the digital still camera 10 records still image data, which is obtained by capturing an image of the subject, on the recording medium 30 loaded in the medium controller 15. The still image data is recorded on the recording medium 30 under the directory structure based on the above rules. When the MPU 19 reads and runs the data read/write program stored in the ROM 14, the digital still camera 10 reads the still image data stored in the recording medium 30 loaded in the medium controller 15 and displays the still image data on the display unit 18. Specifically, when writing, the digital still camera 10 writes the still image data obtained by capturing the image to the directory "DCIM" in the recording medium 30. When reading, the digital still camera 10 reads the still image data from the directory "DCIM" and displays the still image data on the display unit 18.

The digital still camera 10 reads and writes data by having the MPU 19 read and run the data read/write program stored in the ROM 14. The digital still camera 10 performs processes as shown in FIGS. 5 and 6 and searches for a directory recorded on the recording medium 30.

Figure 5:
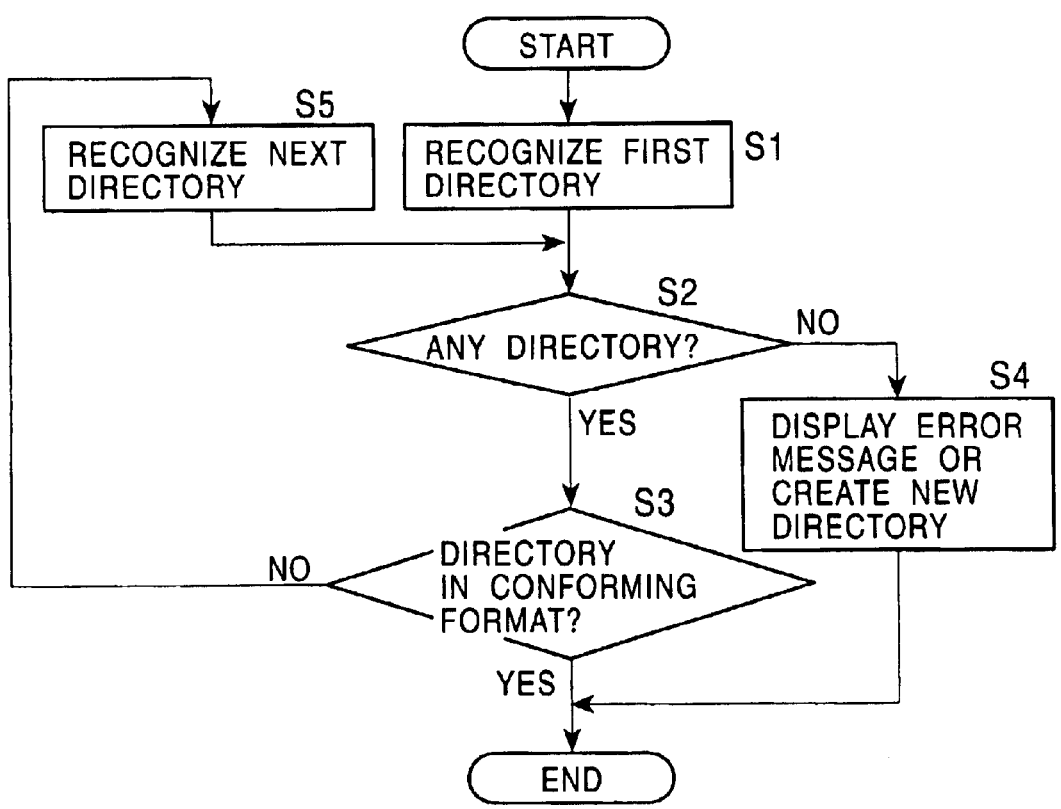
FIG. 5 is a flowchart showing a process for searching for a directory for storing data in the conforming format by the digital still camera shown in FIG. 4.
Figure 6:
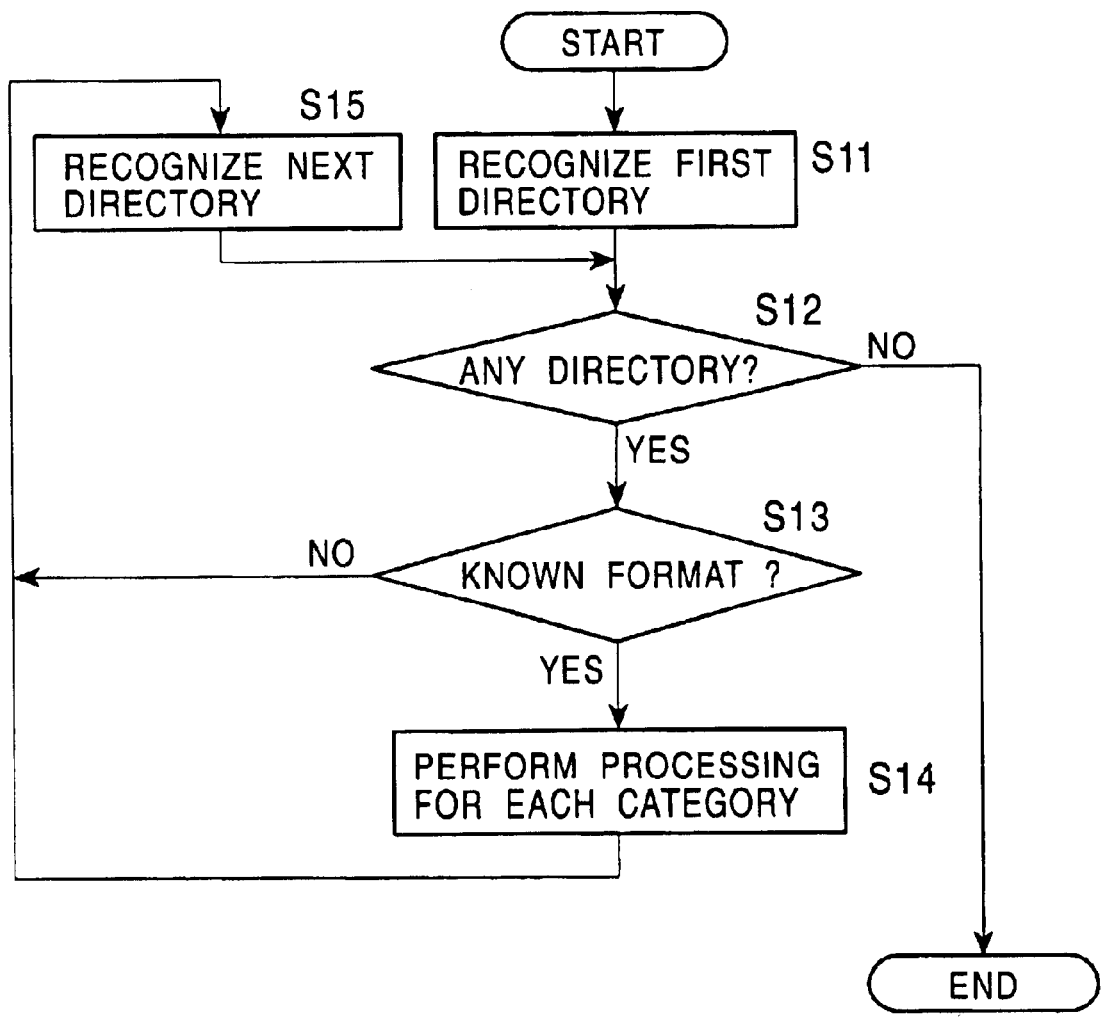
FIG. 6 is a flowchart showing a process for searching for a directory for storing data in a non-conforming format by the digital still camera shown in FIG. 4.

FIG. 5 is a flowchart showing a process of searching for a directory that stores data in a conforming format of the digital still camera 10, namely, the directory "DCIM". In step S1, the digital still camera 10 reads data from the recording medium 30 via the medium controller 15 under the control of the MPU 19, and recognizes an arbitrary directory from directories recorded on the recording medium 30 as a first directory.

In step S2, the digital still camera 10 under the control of the MPU 19 determines whether the directory is recorded on the recording medium 30.

When the determination is negative, in step S4, the digital still camera 10 under the control of the MPU 19 creates a new directory "DCIM" when writing, or displays an error message on the display unit 18 to inform the user that the directory is not retrieved. The process is then terminated.

In contrast, if the determination is affirmative, the digital still camera 10 under the control of the MPU 19 determines, in step S3, whether the recognized directory is a directory in the conforming format, namely, the directory "DCIM".

If the determination is affirmative, the digital still camera 10 terminates the process. The digital still camera 10 may display a message on the display unit 18 indicating that a directory in the conforming format is recorded on the recording medium 30.

In contrast, if the determination is negative, in step S5, the digital still camera 10 under the control of the MPU 19 reads the recording medium 30 via the medium controller 15 and recognizes the subsequent directory stored in the recording medium 30. The process from step S2 onward is repeated.

Accordingly, the digital still camera 10 searches for a directory storing data in the conforming format recorded on the recording medium 30, namely, the directory "DCIM".

FIG. 6 is a flowchart showing a process of searching sir for a directory that stores data in a non-conforming format of the digital still camera 10, that is, a directory other than the predetermined directory "DCIM". In step S11, the digital still camera 10 under the control of the MPU 19 reads the recording medium 30 via the medium controller 15 and recognizes an arbitrary directory from directories recorded on the recording medium 30 as a first directory.

In step S12, the digital still camera 10 under the control of the MPU 19 determines whether the directory is recorded on the recording medium 30.

When the determination is negative, the process is terminated. Upon termination, the digital still camera 10 may display a message on the display unit 18 indicating that the directory is not recorded on the recording medium 30.

In contrast, when the directory is recorded on the recording medium 30, in step S13, the digital still camera 10 under the control of the MPU 19 determines whether the format of data in the recognized directory is known.

When the determination is affirmative, in step S14, the digital still camera 10 under the control of the MPU 19 performs specific processing steps according to each category. For example, the digital still camera 10 displays the category of the directory on the display unit 18. When erasing the directory, the digital still camera 10 displays a message for confirming erasing of the directory. Subsequently the process proceeds to step S15.

In contrast, when the format of the recognized directory is unknown, in step S15, the digital still camera 10 under the control of the MPU 19 reads the recording medium 30 via the medium controller 15 and recognizes the subsequent directory recorded on the recording medium 30. The process from step S12 onward is repeated.

Accordingly, the digital still camera 10 searches for a directory storing data in the non-conforming format recorded on the recording medium 30, that is, the directory other than the directory "DCIM".

Figure 7:
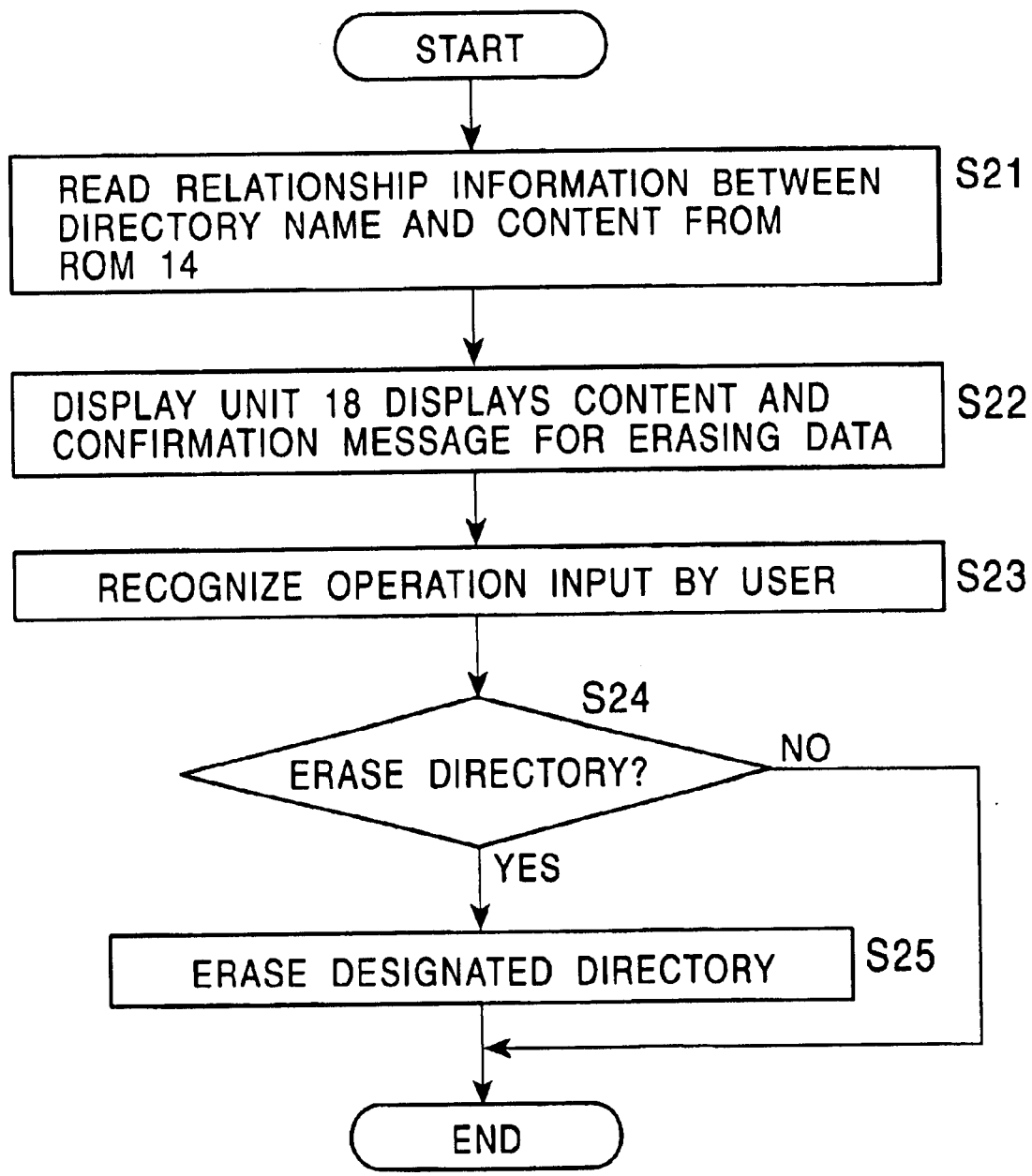
FIG. 7 is a flowchart showing a process for erasing the data belonging to a category not conforming to the digital still camera shown in FIG. 4 while asking a user for confirmation in category units.

FIG. 7 is a flowchart showing a process of erasing data belonging to a non-conforming category while asking the user for confirmation for each category.

Specifically, in step S21, the digital still camera 10 under the control of the MPU 19 reads data in the recording medium 30 via the medium controller 15 and recognizes the name of a directory recorded on the recording medium 30. Under the control of the MPU 19, the digital still camera 10 reads corresponding relationship information indicating the corresponding relationship between the directory name and the content for each category from the ROM 14, and compares the name of the directory recorded on the recording medium 30 with the directory name indicated in the corresponding relationship information.

When the directory name indicated in the corresponding relationship information coincides with the name of the directory stored in the recording medium 30, in step S22, the digital still camera 10 displays, on the display unit 18, the content of the directory indicating that the directory stores, for example, audio data, and a confirmation message for asking the user to erase the directory.

In step S23, under the control of the MPU 19, the digital still camera 10 recognizes the content of operation input by the user by operating the operating unit 16 in response to the confirmation in step S22.

In step S24, the digital still camera 10 under the control of the MPU 19 determines whether to erase the directory based on the operation content recognized in step S23.

When the directory is not to be erased, the digital still camera 10 does not erase the directory, and the process is then terminated.

When the directory is to be erased, in step S25, the digital still camera 10 under the control of the MPU 19 erases the directory designated by the user through the operating unit 16 and data stored in that directory. The process is then terminated.

Accordingly, the digital still camera 10 can erase data belonging to the non-conforming category recorded on the recording medium 30 while asking the user for confirmation for each category.

Figure 8:
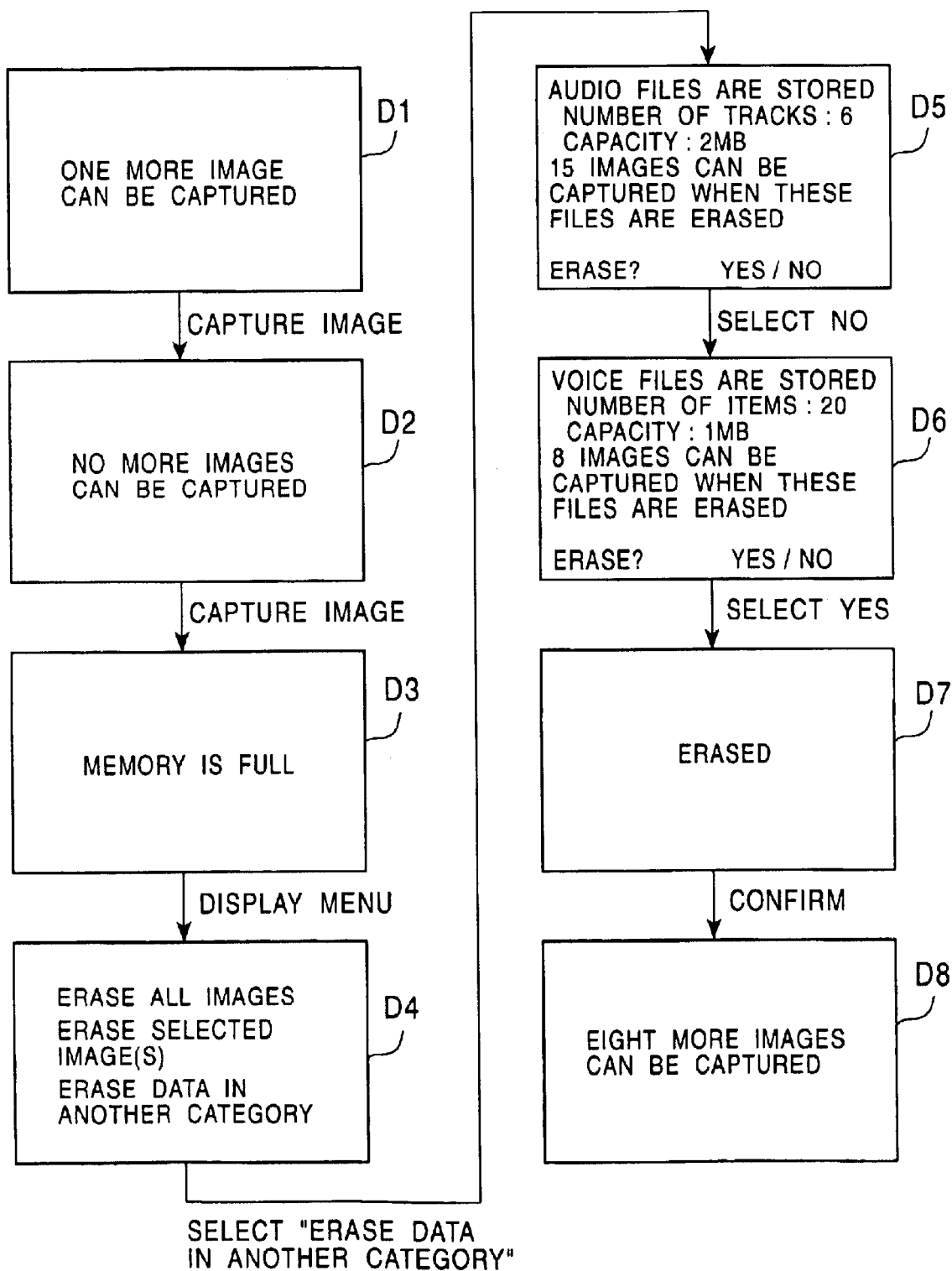
FIG. 8 is an illustration of a sequence of displayed content in accordance with an operation of erasing unnecessary data when the recording capacity of the recording medium loaded in the digital still camera shown in FIG. 4 becomes insufficient.
Figure 9:
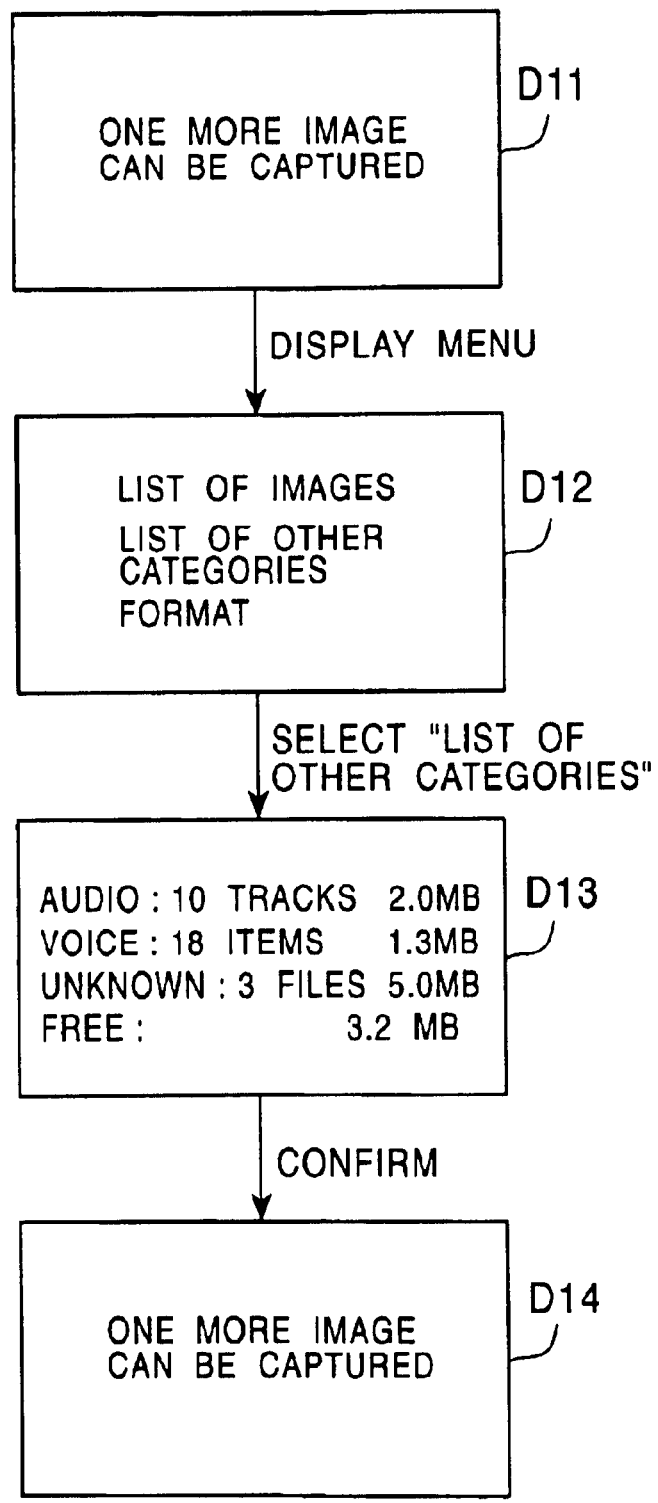
FIG. 9 is an illustration of a sequence of displayed content in accordance with an operation of receiving information concerning other categories recorded on the recording medium loaded in the digital still camera shown in FIG. 4.

Referring to FIGS. 8 and 9, more specific examples of the operation of the digital still camera 10 are described using the content displayed on the display unit 18 in accordance with the operation.

Referring to FIG. 8, the digital still camera 10 captures an image of a subject, and the obtained still image data is to be recorded on the recording medium 30. Since the recording capacity of the recording medium 30 is insufficient, unnecessary data is to be erased.

When the residual recording capacity of the recording medium 30 is sufficient for recording data for one still image, the digital still camera 10 under the control of the MPU 19 displays, on the display unit 18, a message such as "one more image can be captured", as shown in display screen D1 in FIG. 8.

When the user captures an image of the subject, the digital still camera 10 under the control of the MPU 19 displays, on the display unit 18, a message such as "no more images can be captured", as shown in display screen D2.

When the user tries to capture another image of the subject, the digital still camera 10 displays, on the display unit 18, a message such as "memory is full", as shown in display screen D3, since the residual recording capacity of the recording medium 30 is insufficient.

The user operates the operating unit 16, and the digital still camera 10 under the control of the MPU 19 displays a menu screen as shown in display screen D4 on the display unit 18. The menu screen offers alternatives, such as "erase all images" for erasing all still image data stored in the directory "DCIM" which is the conforming category, "erase selected image(s)" for selecting arbitrary still image data of the still image data stored in the directory "DCIM" which is the conforming category and erasing the selected still image data, and "erase data in another category" for erasing data belonging to a non-conforming category.

The user chooses "erase data in another category" from the alternatives by operating the operating unit 16. The digital still camera 10 under the control of the MPU 19 searches for another category, that is, the non-conforming category, recorded on the recording medium 30. As shown in display screen D5, the display unit 18 displays the contents of another category retrieved, and alternatives asking the user whether to erase the directory and data belonging to that category. For example, when the recording medium 30 stores a directory "HIFI" as another category, the display unit 18 displays the contents of the category as follows. Specifically, the contents include a message indicating that audio files (music files) are recorded, the number of audio files stored in the directory "HIFI", that is, the number of tracks, the capacity of all audio files, and the number of still images corresponding to that capacity.

When the user selects "no" from the alternatives by operating the operating unit 16, the digital still camera 10 under the control of the MPU 19 searches for another category, recorded on the recording medium 30, subsequent to the above category. As shown in display screen D6, the display unit 18 displays the contents of the category retrieved and alternatives for asking the user whether to erase the directory and data belonging to the category. When a directory "VOICE" is recorded on the recording medium as another category, the digital still camera 10 displays, on the display unit 18, the contents of the category as follows.

Specifically, the contents include a message indicating that voice files are recorded, the number of voice files, that is, the number of items, the capacity of all voice files, and the number of still images corresponding to that capacity.

When the user selects "yes" from the alternatives by operating the operating unit 16, the digital still camera 10 under the control of the MPU 19 erases all voice files including the directory "VOICE". As shown in display screen D7, the display unit 18 displays a message such as "erased".

When it is confirmed that all the voice files including the directory "VOICE" are erased by operating the operating unit 16 by the user, the digital still camera 10 under the control of the MPU 19 displays a message such as "eight more images can be captured", as shown in display screen D8, on the display unit 18.

Accordingly, the digital still camera 10 can increase the free recording capacity by erasing unnecessary data belonging to the non-conforming category.

Referring to FIG. 9, when the user wants to receive information concerning other categories, such as a list of the numbers of data belonging to other categories recorded on the recording medium 30, the digital still camera 10 displays a series of display screens on the display unit 18.

When the residual recording capacity of the recording medium 30 is sufficient to record one still image, the digital still camera 10 under the control of the MPU 19 displays, on the display unit 18, a message such as "one more image can be captured", as shown in display screen D11 in FIG. 9.

When the user operates the operating unit 16 for the purpose of displaying a menu screen in order to receive a list of the numbers of data belonging to other categories recorded on the recording medium 30, the digital still camera 10 under the control of the MPU 19 displays, on the display unit 18, a menu screen shown in display screen D12. The menu screen shown in display screen D12 includes alternatives such as "list of images" for displaying a list of information on still image data stored in the directory "DCIM" which is the conforming category, "list of other categories" for displaying a list of information on non-conforming categories, and "format" for initializing the recording medium 30.

When the user chooses "list of other categories" from the alternatives by operating the operating unit 16, the digital still camera 10 under the control of the MPU 19 searches for the entirety of other categories recorded on the recording medium 30. As shown in display screen D13, the digital still camera 10 displays, on the display unit 18, the contents of other categories retrieved and the free capacity of the recording medium 30. For example, when the recording medium 30 stores the directories "HIFI" and "VOICE" and files belonging to unknown categories as other categories, the digital still camera 10 displays, on the display unit 18, the contents of the categories as follows. Specifically, the displayed contents include the number of audio files stored in the directory "HIFI", that is, the number of tracks, the capacity of all audio files, the number of voice files stored in the directory "VOICE", that is, the number of items, the capacity of all voice files, the number of files belonging to unknown categories, the capacity of these files, and the free capacity of the recording medium 30.

The user confirms the information on other categories by operating the operating unit 16, and the digital still camera 10 under the control of the MPU 19 displays, on the display unit 18, a message such as "one more image can be captured", as shown in display screen D14.

Accordingly, the digital still camera 10 enables the user to receive information concerning other categories.

The digital still camera 100 performs the processing steps such as searching for the category and erasing the category in the operation illustrated with reference to FIGS. 8 and 9 by performing the processes shown in FIGS. 5 to 7. As described above, the processing steps are performed by executing the data read/write program stored in the ROM 14 by the MPU 19. The data read/write program is not necessarily stored beforehand in the ROM 14. For example, the data read/write program can be supplied to the user by a storage medium such as a CD-ROM or via communication lines, and the user stores the data read/write program in a storage medium such as the RAM 13 or the like.

As described above, the data read/write system including the recording medium and the AV apparatus is capable of recognizing data in the non-conforming format by clearly defining the method of writing data to the recording medium and by sharing minimal information irrespective of the data formats. In addition, the data read/write system can handle data so as to erase the data in the non-conforming format. Even when the data in the non-conforming format is simultaneously recorded on the recording medium, the data read/write system can provide the user with advantages.

The present invention is not limited to the above embodiments. According to the above embodiments, for example, a directory, such as the directory "DCIM", for each application is created in the root directory of the recording medium. Alternatively, a directory for each application can be created in a predetermined directory other than the root directory.

According to the above embodiments, the case of erasing data is described by way of example of processing data belonging to categories to which the AV apparatus does not conform. The present invention is also applicable to other processes such as duplication of data.

According to the above embodiments, the messages displayed on the display unit 18 are illustrated by way of example. The present invention can be applied to messages indicating the same meanings as the above messages. Besides messages indicating the contents of errors, it is preferable that messages for informing the user of how to deal with the errors be displayed.

According to the above embodiments, the digital still camera 10 is used as the AV apparatus. The present invention can be applied to any AV apparatus for reading and/or writing data such as audio data to a loaded recording medium. The present invention is also applicable to a compound apparatus for using both the recording medium and another type of storage medium.

The present invention is applicable not only to the AV apparatus conforming to a single category, but also to an AV apparatus conforming to a plurality of categories.

The present invention is applicable to an apparatus which is incapable of reading the content of data but has the ability to know the content of data and to measure the residual recording capacity of the recording medium.

The present invention is applicable to a recording medium other than that using the flash memory as long as the recording medium stores data in accordance with the above rules.

Although the corresponding relationship information indicating the corresponding relationship between the directory name and the content for each category is stored in the ROM 14 in the above embodiments, the present invention is also applicable to an AV apparatus which does not store the corresponding relationship information. In other words, the name of the directory recorded on the recording medium is defined as, for example, "VOICE", so that it is understandable to the user. This enables the user to know the content by looking at the displayed directory name even when the AV apparatus does not store the corresponding relationship information. Accordingly, the present invention can deal with a case in which a new category is created.

According to the present invention, a file indicating the content of a directory is stored in that directory, and it is thus not necessary for the AV apparatus to store the corresponding relationship information. Referring to FIG. 10, a file "purpose.dir" indicating that the directory "HIFH" is for storing audio data (music data) is stored in the directory "HIFI" recorded on the recording medium. By referring to the file, the AV apparatus recognizes the corresponding relationship between the directory name and the content for each category.

Accordingly, the present invention is intended to cover various modifications and equivalent arrangements included within the spirit and scope of the appended claims.

What is claimed is:

1. A data reading-and-writing apparatus for reading and writing data in at least one conforming format from and to a recording medium capable of recording data in a plurality of formats, said data reading-and-writing apparatus comprising:

reading-and-writing means for performing reading and writing to the recording medium;

control means for controlling said data reading-and-writing apparatus so as to record the data in the conforming format in a predetermined directory of the recording medium, to read the data in the conforming format from the predetermined directory of the recording medium, and to recognize and handle data in a non-conforming format, which differs from the conforming format, by referring to a directory name of the directory which is in a root directory other than the predetermined directory of the recording medium, wherein said data in non-conforming format is data that is incapable of being processed by said reading-and-writing apparatus;

storing means for storing said data in non-conforming format;

display means for performing predetermined display, under the control of said control means, based on the information concerning the data in the non-conforming format; and operating means for giving instructions, wherein said control means causes said display means to perform predetermined display in accordance with instructions given by said operating means.

2. A data reading-and-writing apparatus according to claim 1, wherein said data reading-and-writing apparatus informs a user of a state of said data reading-and-writing apparatus based on the information concerning the data in the non-conforming format.

3. A data reading-and-writing apparatus according to claim 2, further comprising display means for performing predetermined display, under the control of said control means, based on the information concerning the data in the non-conforming format.

4. A data reading-and-writing apparatus according to claim 3, wherein said control means controls said display means so as to display the size of the data in the non-conforming format.

5. A data reading-and-writing apparatus according to claim 3, further comprising operating means for giving instructions, wherein said control means causes said display means to perform predetermined display in accordance with the instructions given by said operating means.

6. A data reading-and-writing apparatus according to claim 5, wherein said control means causes said display means to perform predetermined display in response to the instruction given by said operating means to determine the content of the recording medium.

7. A data reading-and-writing apparatus according to claim 5, wherein said control means causes said display means to perform predetermined display in response to the instruction given by said operating means to read the recording medium.

8. A data reading-and-writing apparatus according to claim 2, further comprising light emitting means for emitting light, wherein said control means varies a light emitting state of said light emitting means based on the information concerning the data in the non-conforming format.

9. A data reading-and-writing apparatus according to claim 2, further comprising beep generating means for generating a beep, under the control of said control means, based on the information concerning the data in the non-conforming format.

10. A data reading-and-writing apparatus according to claim 3, wherein said control means controls said display means so as to display the number of items in the data in the non-conforming format.

11. A data reading-and-writing apparatus according to claim 1, wherein said control means controls said reading-and-writing means so as to erase some of the data in the non-conforming format.

12. A data reading-and-writing apparatus according to claim 11, wherein said control means controls said reading-and-writing means so as to erase all the data in the non-conforming format.

13. A data reading-and-writing apparatus according to claim 11, wherein said control means controls said reading-and-writing means so as to erase the data in the non-conforming format in category units.

14. A data reading-and-writing apparatus according to claim 11, wherein said control means controls said reading-and-writing means so as to erase the data in the non-conforming format in file units.

15. A data reading-and-writing apparatus according to claim 11, further comprising display means for performing display, wherein said control means controls said display means and said reading-and-writing means so that said display means displays the information concerning the data in the non-conforming format prior to erasing the data.

16. A data reading-and-writing apparatus according to claim 11, wherein said control means controls said reading-and-writing means so as to erase the data in the non-conforming format when the residual capacity of the recording medium for writing the data in the conforming format is insufficient.

17. A data reading-and-writing apparatus according to claim 1, wherein the data in said plurality of formats are stored in directories having corresponding predetermined names; and said control means refers to the directories based on the names of the directories.

18. A data reading-and-writing apparatus according to claim 17, wherein the directories are created in a root directory of the recording medium.

19. A data reading-and-writing apparatus according to claim 17, wherein the directories are created in a specific directory of the recording medium.

20. A data reading-and-writing apparatus according to claim 17, further comprising:
   storage means for storing corresponding relationship information indicating the corresponding relationships between the names of the directories and the content of the data stored in the directories;
   wherein said control means compares, based on the corresponding relationship information in said storage means, the names of the directories recorded on the recording medium with the names of the directories indicated in the corresponding relationship information.

21. A data reading-and-writing apparatus according to claim 17, wherein the directories store data indicating the content of the data stored in the directories; and
   said control means recognizes the content of the data stored in the directories based on the data indicating the content of the data.

22. A data reading-and-writing apparatus according to claim 1, wherein the conforming format includes one type.

23. A data reading-and-writing apparatus according to claim 1, wherein the recording medium includes a non-volatile memory.

24. A data reading-and-writing method for a data reading-and-writing apparatus for reading and writing data in at least one conforming format from and to a recording medium capable of recording data in a plurality of formats, said data reading-and-writing method comprising the steps of:
   writing the data in the conforming format in a predetermined directory of the recording medium;
   reading the data in the conforming format from the predetermined directory of the recording medium;
   recognizing and handling data in a non-conforming format, which differs from the conforming format, by referring to a directory name of the directory which is in a root directory other than the predetermined directory of the recording medium, wherein said data in non-conforming format is data that is incapable of being processed by said reading-and-writing apparatus;
   storing said data in non-conforming format;
   giving instructions for performing a predetermined display; and
   performing predetermined display based on the given instructions and information concerning the data in the non-conforming format.

25. A data reading-and-writing method according to claim 24, further comprising an informing step of informing a user of a state of said data reading-and-writing apparatus based on the information concerning the data in the non-conforming format.

26. A data reading-and-writing method according to claim 25, further comprising a display step of performing predetermined display based on the information concerning the data in the non-conforming format.

27. A data reading-and-writing method according to claim 26, wherein, in said display step, the number of items in the data in the non-conforming format is displayed.

28. A data reading-and-writing method according to claim 26, wherein, in said display step, the size of the data in the non-conforming format is displayed.

29. A data reading-and-writing method according to claim 26, wherein, in said display step, predetermined display is performed in accordance with instructions given by operating means for giving the instructions.

30. A data reading-and-writing method according to claim 26, wherein, in said display step, predetermined display is performed in response to an instruction to determine the content of the recording medium.

31. A data reading-and-writing method according to claim 26, wherein, in said display step, predetermined display is performed in response to an instruction to read the recording medium.

32. A data reading-and-writing method according to claim 25, further comprising a light emitting step of emitting light, wherein a light emitting state is varied based on the information concerning the data in the non-conforming format.

33. A data reading-and-writing method according to claim 25, further comprising a beep generating step of generating a beep based on the information concerning the data in the non-conforming format.

34. A data reading-and-writing method according to claim 24, further comprising an erasing step of erasing some of the data in the non-conforming format.

35. A data reading-and-writing method according to claim 34, wherein all the data in the non-conforming format is erased.

36. A data reading-and-writing method according to claim 34, wherein the data in the non-conforming format is erased in category units.

37. A data reading-and-writing method according to claim 34, wherein the data in the non-conforming format is erased in file units.

38. A data reading-and-writing method according to claim 34, further comprising a display step of displaying the information concerning the data in the non-conforming format prior to erasing the data.

39. A data reading-and-writing method according to claim 34, wherein the data in the non-conforming format is erased when the residual capacity of the recording medium for writing the data in the conforming format is insufficient.

40. A data reading-and-writing method according to claim 24, wherein the data in said plurality of formats are stored in directories having corresponding predetermined names; and
   the directories are referred to based on the names of the directories.

41. A data reading-and-writing method according to claim 40, wherein the directories are created in a root directory of the recording medium.

42. A data reading-and-writing method according to claim 40, wherein the directories are created in a specific directory of the recording medium.

43. A data reading-and-writing method according to claim 40, further comprising the steps of:
   storing corresponding relationship information indicating the corresponding relationships between the names of the directories and the content of the data stored in the directories; and
   comparing, based on the corresponding relationship information, the names of the directories recorded on the recording medium with the names of the directories indicated in the corresponding relationship information.

44. A data reading-and-writing method according to claim 40, wherein the directories store data indicating the content of the data stored in the directories; and
   the content of the data stored in the directories is recognized based on the data indicating the content of the data.

45. A data reading-and-writing method according to claim 24, wherein the conforming format includes one type.

46. A data reading-and-writing method according to claim 24, wherein the recording medium includes a non-volatile memory.

47. A data reading-and-writing system having a recording medium capable of recording data in a plurality of formats and a data reading-and-writing apparatus for reading and writing data in at least one conforming format from and to the recording medium, said data reading-and-writing system comprising:
   reading-and-writing means for performing reading and writing to the recording medium;
   control means for controlling said data reading-and-writing apparatus so as to record the data in the conforming format in a predetermined directory of the recording medium, to read the data in the conforming format from the predetermined directory of the recording medium, and to recognize and handle data in a non-conforming format, which differs from the conforming format, by referring to a directory other than the predetermined directory of the recording medium to determine the format of said newly received data, wherein said data in non-conforming format is data that is incapable of being processed by said reading-and-writing apparatus;
   storing means for storing said data in non-conforming format;
   display means for performing predetermined display, under the control of said control means, based on the information concerning the data in the non-conforming format; and
   operating means for giving instructions, wherein said control means causes said display means to perform predetermined display in accordance with instructions given by said operating means.

48. A data reading-and-writing system according to claim 47, wherein said data reading-and-writing apparatus informs a user of a state of said data reading-and-writing apparatus based on the information concerning the data in the non-conforming format.

49. A data reading-and-writing system according to claim 48, further comprising display means for performing predetermined display, under the control of said control means, based on the information concerning the data in the non-conforming format.

50. A data reading-and-writing system according to claim 49, wherein said control means controls said display means so as to display the number of items in the data in the non-conforming format.

51. A data reading-and-writing system according to claim 49, wherein said control means controls said display means so as to display the size of the data in the non-conforming format.

52. A data reading-and-writing system according to claim 49, further comprising operating means for giving instructions, wherein said control means causes said display means to perform predetermined display in accordance with the instructions given by said operating means.

53. A data reading-and-writing system according to claim 52, wherein said control means causes said display means to perform predetermined display in response to the instruction given by said operating means to determine the content of the recording medium.

54. A data reading-and-writing system according to claim 52, wherein said control means causes said display means to perform predetermined display in response to the instruction given by said operating means to read the recording medium.

55. A data reading-and-writing system according to claim 48, further comprising light emitting means for emitting light, wherein said control means varies a light emitting state of said light emitting means based on the information concerning the data in the non-conforming format.

56. A data reading-and-writing system according to claim 48, further comprising beep generating means for generating a beep, under the control of said control means, based on the information concerning the data in the non-conforming format.

57. A data reading-and-writing system according to claim 47, wherein said control means controls said reading-and-writing means so as to erase some of the data in the non-conforming format.

58. A data reading-and-writing system according to claim 57, wherein said control means controls said reading-and-writing means so as to erase all the data in the non-conforming format.

59. A data reading-and-writing system according to claim 57, wherein said control means controls said reading-and-writing means so as to erase the data in the non-conforming format in category units.

60. A data reading-and-writing system according to claim 57, wherein said control means controls said reading-and-writing means so as to erase the data in the non-conforming format in file units.

61. A data reading-and-writing system according to claim 57, further comprising display means for performing display, wherein said control means controls said display means and said reading-and-writing means so that said display means displays the information concerning the data in the non-conforming format prior to erasing the data.

62. A data reading-and-writing system according to claim 57, wherein said control means controls said reading-and-writing means so as to erase the data in the non-conforming format when the residual capacity of the recording medium for writing the data in the conforming format is insufficient.

63. A data reading-and-writing system according to claim 47, wherein the data in said plurality of formats are stored in directories having corresponding predetermined names; and
   said control means refers to the directories based on the names of the directories.

64. A data reading-and-writing system according to claim 63, wherein the directories are created in a root directory of the recording medium.

65. A data reading-and-writing system according to claim 63, wherein the directories are created in a specific directory of the recording medium.

66. A data reading-and-writing system according to claim 63, further comprising:
   storage means for storing corresponding relationship information indicating the corresponding relationships between the names of the directories and the content of the data stored in the directories;
   wherein said control means compares, based on the corresponding relationship information in said storage means, the names of the directories recorded on the recording medium with the names of the directories indicated in the corresponding relationship information.

67. A data reading-and-writing system according to claim 63, wherein the directories store data indicating the content of the data stored in the directories; and
   said control means recognizes the content of the data stored in the directories based on the data indicating the content of the data.

68. A data reading-and-writing system according to claim 47, wherein the conforming format includes one type.

69. A data reading-and-writing system according to claim 47, wherein the recording medium includes a non-volatile memory.

70. A program providing medium for providing a data reading-and-writing program to be applied to a data reading-and-writing apparatus for reading and writing-data in at least one conforming format from and to a recording medium capable of recording data in a plurality of formats, said data reading-and-writing program comprising the steps of:

writing the data in the conforming format in a predetermined directory of the recording medium;

reading the data in the conforming format from the predetermined directory of the recording medium;

recognizing and handling data in a non-conforming format, which differs from the conforming format, by referring to a directory name of the directory which is in a root directory other than the predetermined directory of the recording medium, wherein said data in non-conforming format is data that is incapable of being processed by said reading-and-writing apparatus;

storing said data in non-conforming data giving instructions for performing a predetermined display; and performing predetermined display based on the given instructions and information concerning the data in the non-conforming format.

71. A program providing medium according to claim 70, wherein said data reading-and-writing program further comprises an informing step of informing a user of a state of said data reading-and-writing apparatus based on the information concerning the data in the non-conforming format.

72. A program providing medium according to claim 71, wherein said data reading-and-writing program further comprises a display step of performing predetermined display based on the information concerning the data in the non-conforming format.

73. A program providing medium according to claim 72, wherein said data reading-and-writing program displays, in said display step, the number of items in the data in the non-conforming format.

74. A program providing medium according to claim 72, wherein said data reading-and-writing program displays, in said display step, the size of the data in the non-conforming format.

75. A program providing medium according to claim 72, wherein, in said display step, said data reading-and-writing program performs predetermined display in accordance with instructions given by operating means for giving the instructions.

76. A program providing medium according to claim 75, wherein, in said display step, said data reading-and-writing program performs predetermined display in response to the instruction to determine the content of the recording medium.

77. A program providing medium according to claim 75, wherein, in said display step, said data reading-and-writing program performs predetermined display in response to the instruction to read the recording medium.

78. A program providing medium according to claim 70, wherein said data reading-and-writing program further comprises an erasing step of erasing the data in the non-conforming format.

79. A program providing medium according to claim 78, wherein said data reading-and-writing program further comprises a display step of displaying the information concerning the data in the non-conforming format prior to erasing the data.

80. A program providing medium according to claim 78, wherein said data reading-and-writing program erases the data in the non-conforming format when the residual capacity of the recording medium for writing the data in the conforming format is insufficient.

81. A program providing medium according to claim 70, wherein the data in said plurality of formats are stored in directories having corresponding predetermined names; and said data reading-and-writing program refers to the directories based on the names of the directories.

82. A program providing medium according to claim 81, wherein said data reading-and-writing program further comprising the steps of:

storing corresponding relationship information indicating the corresponding relationships between the names of the directories and the content of the data stored in the directories; and comparing, based on the corresponding relationship information, the names of the directories recorded on the recording medium with the names of the directories indicated in the corresponding relationship information.

83. A program providing medium according to claim 81, wherein the directories store data indicating the content of the data stored in the directories; and said data reading-and-writing program recognizes the content of the data stored in the directories based on the data indicating the content of the data.

* * * * *